(12) United States Patent
Hoshiko

(10) Patent No.: US 12,148,977 B2
(45) Date of Patent: Nov. 19, 2024

(54) DIRECTIONAL COUPLER HAVING WIDE BAND HIGH DIRECTIVITY AND FLAT FREQUENCY RESPONSE

(71) Applicant: BIRD TECHNOLOGIES GROUP INC., Solon, OH (US)

(72) Inventor: Daniel Hoshiko, University Heights, OH (US)

(73) Assignee: BIRD TECHNOLOGIES GROUP INC., Solon, OH (US)

( * ) Notice: Subject to any disclaimer, the term of this patent is extended or adjusted under 35 U.S.C. 154(b) by 0 days.

(21) Appl. No.: 18/698,569

(22) PCT Filed: Jun. 15, 2023

(86) PCT No.: PCT/US2023/025478
§ 371 (c)(1),
(2) Date: Apr. 4, 2024

(87) PCT Pub. No.: WO2023/244761
PCT Pub. Date: Dec. 21, 2023

(65) Prior Publication Data
US 2024/0332777 A1    Oct. 3, 2024

Related U.S. Application Data

(60) Provisional application No. 63/352,228, filed on Jun. 15, 2022, provisional application No. 63/393,236, filed on Jul. 29, 2022.

(51) Int. Cl.
| | |
|---|---|
| *H03F 1/02* | (2006.01) |
| *H01P 5/18* | (2006.01) |
| *H03F 3/45* | (2006.01) |

(52) U.S. Cl.
CPC ........... *H01P 5/18* (2013.01); *H03F 3/45475* (2013.01); *H03F 2200/451* (2013.01)

(58) Field of Classification Search
CPC ................. H03F 1/02; H03F 1/07; H03F 3/45
(Continued)

(56) References Cited

U.S. PATENT DOCUMENTS

| | | | |
|---|---|---|---|
| 7,064,606 B2 * | 6/2006 | Louis ...................... | H03F 3/602 330/53 |
| 7,332,960 B2 * | 2/2008 | Burns .................... | H04B 1/123 330/124 R |

(Continued)

FOREIGN PATENT DOCUMENTS

| | | |
|---|---|---|
| CN | 216013492 U | 3/2022 |
| EP | 3293530 A1 | 3/2018 |

OTHER PUBLICATIONS

Patent Cooperation Treaty (PCT), International Search Report and Written Opinion for Application PCT/US2023/025478 filed on Jun. 15, 2023, mailed Oct. 6, 2023, 9 pages, International Searching Authority, KR.

*Primary Examiner* — Henry Choe
(74) *Attorney, Agent, or Firm* — McDonald Hopkins LLC

(57) ABSTRACT

Disclosed is a directional coupler circuit that has improved performance in the areas of directivity and frequency range, when compared with conventional directional couplers. The disclosed directional coupler circuit improves performance in at least two ways. The first is by the use of the voltage operational amplifier that unloads the capacitive voltage divider. The second is using forward and reflected transimpedance operational amplifier circuits to provide a short circuit to the coupling coil, namely a forward direction current sample circuit having a forward transimpedance operational amplifier and a reflected direction current sample circuit having a reflected transimpedance operational amplifier.

30 Claims, 7 Drawing Sheets

(58) Field of Classification Search
USPC .................................... 330/124 R, 295, 252
See application file for complete search history.

(56) References Cited

U.S. PATENT DOCUMENTS

| | | | |
|---|---|---|---|
| 2006/0006937 A1* | 1/2006 | Burns | H03F 3/602 |
| | | | 330/124 R |
| 2009/0302945 A1* | 12/2009 | Catoiu | H03F 1/3282 |
| | | | 330/252 |
| 2013/0207710 A1 | 8/2013 | Basawapatna | |
| 2017/0085245 A1 | 3/2017 | Nuttapong et al. | |
| 2018/0106838 A1 | 4/2018 | Dummermuth | |

* cited by examiner

DIRECTIONAL COUPLER HAVING WIDE BAND HIGH DIRECTIVITY AND FLAT FREQUENCY RESPONSE

CROSS REFERENCE TO RELATED APPLICATIONS

This application is the US national phase entry of International Patent Application No. PCT/US2023/025478 filed on Jun. 15, 2023, which claims priority to U.S. Patent Application No. 63/352,228, filed on Jun. 15, 2022, and U.S. Patent Application No. 63/393,236, filed on Jul. 29, 2022, which are incorporated by reference in their entireties.

TECHNICAL FIELD

The present invention relates to a directional coupler for measuring the radio frequency (RF) power in a coaxial transmission line.

BACKGROUND

Directional couplers are traditionally used to measure the RF power in a coaxial transmission line. However, traditional directional coupler designs suffer from shortcomings in the areas of directivity and frequency range.

SUMMARY

The following presents a summary of this disclosure to provide a basic understanding of some aspects. This summary is intended to neither identify key or critical elements nor define any limitations of embodiments or claims. Furthermore, this summary may provide a simplified overview of some aspects that may be described in greater detail in other portions of this disclosure.

In one aspect, provided is a directional coupler circuit having a capacitive divider for sampling a voltage on a center conductor of a transmission line; a coil having mutual inductance with the center conductor for sampling current travelling in a forward direction and a reflected direction on the transmission line, the coil having an upstream end and a downstream end, wherein the coil is configured for sampling current travelling in both the forward direction and the reflected direction on the transmission line.

The directional coupler circuit also includes a combined forward path comprising a forward transimpedance operational amplifier, a voltage operational amplifier, and a forward RF power output. The voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other.

The forward transimpedance operational amplifier receives an upstream sample of a current travelling on the transmission line from the upstream end of the coil, the upstream sample of current comprising both a current sample travelling in the forward direction and a current sample travelling in the reflected direction on the transmission line. The current sample travelling in the forward direction is in phase with the forward voltage on the transmission line, and the current sample travelling in the reflected direction is equal in magnitude with and 180 degrees out of phase from the sample of the reflected voltage on the transmission line. The forward transimpedance operational amplifier outputs a voltage representative of the upstream sample of current travelling on the transmission line.

The outputs of the forward transimpedance operational amplifier and the voltage operational amplifier are combined and outputted using the forward RF power output. When combined, the voltage representation of the current sample travelling in the reflected direction cancels with the sample of the reflected voltage on the transmission line, thereby only a voltage representative of RF power travelling in the forward direction on the transmission line is present at the forward RF power output.

The directional coupler circuit also includes a combined reflected path comprising a reflected transimpedance operational amplifier, a voltage operational amplifier, and a reflected RF power output.

The voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other.

The reflected transimpedance operational amplifier receives a downstream sample of a current travelling on the transmission line from the downstream end of the coil; the downstream sample of current comprising both a current sample travelling in the reflected direction and a current sample travelling in the forward direction on the transmission line. The current sample travelling in the reflected direction is in phase with the reflected voltage on the transmission line and the current sample travelling in the forward direction is equal in magnitude with and 180 degrees out of phase from the sample of forward voltage on the transmission line. The reflected transimpedance operational amplifier outputs a voltage representative of the downstream current travelling on the transmission line.

The outputs of the reflected transimpedance operational amplifier and the voltage operational amplifier are combined and outputted using the reflected RF power output. When combined, the voltage representation of the current sample travelling in the forward direction cancels with the sample of the forward voltage on the transmission line, thereby only a voltage representative of RF power travelling in the reflected direction on the transmission line is present at the reflected RF power output.

In some embodiments, the voltage operational amplifier unloads the capacitive voltage divider, the forward transimpedance operational amplifier provides a short circuit to ground to the upstream end of the coil, and the reflected transimpedance operational amplifier provides a short circuit to ground to the downstream end of the coil. The short-circuiting of the coil eliminates the frequency dependence of the coil when sampling current on the transmission line.

In other embodiments, the capacitive divider is comprised of a first capacitor and at least one second capacitor. The first capacitor is an airgap capacitor formed by the center conductor of the transmission line and a plate.

In further embodiments, one of the at least one second capacitor is variable.

In some embodiments, the outputs from the forward transimpedance operational amplifier and voltage operational amplifier are AC coupled prior to being added together. The outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

In other embodiments, the directional coupler circuit includes a shield to isolate the coil from an electric field of the transmission line.

In further embodiments, the shield is grounded on a single side.

In some embodiments, the directional coupler circuit can be tuned by using a reflected transimpedance operational amplifier feedback resistor, a forward transimpedance operational amplifier feedback resistor, and/or a first capacitor and a second capacitor of the capacitive voltage divider.

In other embodiments, the directional coupler circuit has less than about a 10% variation in coupling and a directivity of at least about 30 dB over at least about a 150:1 frequency range.

In further embodiments, the coil for sampling current travelling in a forward direction and a reflected direction on the transmission line is a single coil.

In another aspect, a directional coupler is provided having a housing with a transmission line and a directional coupler circuit. The transmission line having an RF input at an upstream end and an RF output at a downstream end.

The directional coupler circuit includes a capacitive divider for sampling a voltage on a center conductor of the transmission line. The circuit also includes a coil having mutual inductance with the center conductor for sampling current travelling in a forward direction and a reflected direction on the transmission line, the coil having an upstream end and a downstream end. The coil is configured for sampling current travelling in both the forward direction and the reflected direction on the transmission line.

The directional coupler circuit includes a combined forward path includes a forward transimpedance operational amplifier, a voltage operational amplifier, and a forward RF power output.

The voltage operational amplifier receives a sample of the voltage on the transmission line from the capacitive divider and outputs a voltage representative of the voltage on the transmission line. The sample of voltage on the transmission line containing both the forward and reflected voltage on the transmission line, with the forward and reflected voltage being in-phase with each other.

The forward transimpedance operational amplifier receives an upstream sample of a current travelling on the transmission line from the upstream end of the coil. The upstream sample of current comprising both a current sample travelling in the forward direction and a current sample travelling in the reflected direction on the transmission line; the current sample travelling in the forward direction is in phase with the forward voltage on the transmission line, and the current sample travelling in the reflected direction is equal in magnitude with and 180 degrees out of phase from the sample of the reflected voltage on the transmission line. The forward transimpedance operational amplifier outputs a voltage representative of the upstream sample of current travelling on the transmission line.

The outputs of the forward transimpedance operational amplifier and the voltage operational amplifier are combined and outputted using the forward RF power output. When combined, the voltage representation of the current sample travelling in the reflected direction cancels with the sample of the reflected voltage on the transmission line, thereby only a voltage representative of RF power travelling in the forward direction on the transmission line is present at the forward RF power output.

The directional coupler circuit includes a combined reflected path comprising a reflected transimpedance operational amplifier, a voltage operational amplifier, and a reflected RF power output.

The voltage operational amplifier receives a sample of the voltage on the transmission line from the capacitive divider and outputs a voltage representative of the voltage on the transmission line. The sample of voltage on the transmission line containing both the forward and reflected voltage on the transmission line, with the forward and reflected voltage being in-phase with each other.

The reflected transimpedance operational amplifier receives a downstream sample of a current travelling on the transmission line from the downstream end of the coil; the downstream sample of current comprising both a current sample travelling in the reflected direction and a current sample travelling in the forward direction on the transmission line. The current sample travelling in the reflected direction is in phase with the reflected voltage on the transmission line and the current sample travelling in the forward direction is equal in magnitude with and 180 degrees out of phase from the sample of forward voltage on the transmission line. The reflected transimpedance operational amplifier outputs a voltage representative of the upstream current travelling on the transmission line.

The outputs of the reflected transimpedance operational amplifier and the voltage operational amplifier are combined and outputted using the reflected RF power output. When combined, the voltage representation of the current sample travelling in the forward direction cancels with the sample of the forward voltage on the transmission line, thereby only a voltage representative of RF power travelling in the reflected direction on the transmission line is present at the reflected RF power output.

In further embodiments, the voltage operational amplifier unloads the capacitive voltage divider, the forward transimpedance operational amplifier provides a short circuit to ground to the upstream end of the coil, and the reflected transimpedance operational amplifier provides a short circuit to ground to the downstream end of the coil. The short-circuiting of the coil eliminates the frequency dependence of the coil when sampling current on the transmission line.

In other embodiments, the capacitive divider is comprised of a first capacitor and at least one second capacitor. The first capacitor is an airgap capacitor formed by the center conductor of the transmission line and a plate.

In some embodiments, one of the at least one second capacitor is variable.

In further embodiments, the outputs from the forward transimpedance operational amplifier and voltage operational amplifier are AC coupled prior to being added together. The outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

In other embodiments, the directional coupler also includes a shield to isolate the coil from an electric field of the transmission line.

In some embodiments, the shield is grounded on a single side.

In further embodiments, the directional coupler circuit can be tuned by using a reflected transimpedance operational amplifier feedback resistor, a forward transimpedance operational amplifier feedback resistor, and/or a first capacitor and a second capacitor of the capacitive voltage divider.

In other embodiments, the directional coupler circuit has less than about a 10% variation in coupling and a directivity of at least about 30 dB over at least about a 150:1 frequency range.

In some embodiments, the coil for sampling current travelling in a forward direction and a reflected direction on the transmission line is a single coil.

In a further aspect of the invention, a method of using a directional coupler circuit, the method including, providing a directional coupler circuit having a transmission line, a capacitive divider, a coil, a combined forward path, and a combined reflected path. The combined forward path includes a forward transimpedance operational amplifier, a voltage operational amplifier, and a forward RF power output. The combined reflected path includes a reflected transimpedance operational amplifier, a voltage operational amplifier, and a reflected RF power output.

Sampling a voltage on a center conductor of the transmission line using the capacitive divider. Sampling current travelling in a forward direction and a reflected direction on the transmission line using the coil, the coil having mutual inductance with the center conductor, the coil having an upstream end and a downstream end. The coil is configured for sampling current travelling in both the forward direction and the reflected direction on the transmission line.

Receiving a sample of the voltage on the transmission line from the capacitive divider and outputting a voltage representative of the voltage on the transmission line, using the voltage operational amplifier. The sample of voltage on the transmission line containing both the forward and reflected voltage on the transmission line, with the forward and reflected voltage being in-phase with each other.

Receiving an upstream sample of a current travelling on the transmission line from the upstream end of the coil and outputting a voltage representative of the upstream sample of current travelling on the transmission line using the forward transimpedance operational amplifier, the upstream sample of current comprising both a current sample travelling in the forward direction and a current sample travelling in the reflected direction on the transmission line. The current sample travelling in the forward direction is in phase with the forward voltage on the transmission line, and the current sample travelling in the reflected direction is equal in magnitude with and 180 degrees out of phase from the sample of the reflected voltage on the transmission line.

Combining the outputs of the forward transimpedance operational amplifier and the voltage operational amplifier and outputting the combined outputs using the forward RF power output. When combined, the voltage representation of the current sample travelling in the reflected direction cancels with the sample of the reflected voltage on the transmission line, thereby only a voltage representative of RF power travelling in the forward direction on the transmission line is outputted using the forward RF power output.

Receiving a sample of the voltage on the transmission line from the capacitive divider and outputting a voltage representative of the voltage on the transmission line the voltage operational amplifier. The sample of voltage on the transmission line containing both the forward and reflected voltage on the transmission line, with the forward and reflected voltage being in-phase with each other.

Receiving a downstream sample of a current travelling on the transmission line from the downstream end of the coil outputs a voltage representative of the downstream current travelling on the transmission line using the reflected transimpedance operational amplifier. The downstream sample of current comprising both a current sample travelling in the reflected direction and a current sample travelling in the forward direction on the transmission line. The current sample travelling in the reflected direction is in phase with the reflected voltage on the transmission line and the current sample travelling in the forward direction is equal in magnitude with and 180 degrees out of phase from the sample of forward voltage on the transmission line.

Combining the outputs of the reflected transimpedance operational amplifier and the voltage operational amplifier and outputting the combined outputs using the reflected RF power output. When combined, the voltage representation of the current sample travelling in the forward direction cancels with the sample of the forward voltage on the transmission line, thereby only a voltage representative of RF power travelling in the reflected direction on the transmission line is outputted using the reflected RF power output.

In some embodiments, the voltage operational amplifier unloads the capacitive voltage divider. The forward transimpedance operational amplifier provides a short circuit to ground to the upstream end of the coil, and the reflected transimpedance operational amplifier provides a short circuit to ground to the downstream end of the coil. The short circuiting of the coil eliminates the frequency dependence of the coil when sampling current on the transmission line.

In further embodiments, the capacitive divider is comprised of a first capacitor and at least one second capacitor; the first capacitor is an airgap capacitor formed by the center conductor of the transmission line and a plate.

In other embodiments, one of the at least one second capacitor is variable.

In some embodiments, the outputs from the forward transimpedance operational amplifier and voltage operational amplifier are AC coupled prior to being added together. The outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

In further embodiments, the directional coupler further includes a shield to isolate the coil from an electric field of the transmission line.

In other embodiments, the shield is grounded on a single side.

In some embodiments, the directional coupler circuit can be tuned by using a reflected transimpedance operational amplifier feedback resistor, a forward transimpedance operational amplifier feedback resistor, and/or a first capacitor and a second capacitor of the capacitive voltage divider.

In further embodiments, the directional coupler circuit has less than about a 10% variation in coupling and a directivity of at least about 30 dB over at least about a 150:1 frequency range.

In other embodiments, the coil for sampling current travelling in a forward direction and a reflected direction on the transmission line is a single coil.

The following description and the drawings disclose various illustrative aspects. Some improvements and novel aspects may be expressly identified, while others may be apparent from the description and drawings.

DESCRIPTION OF THE DRAWINGS

The accompanying drawings illustrate various systems, apparatuses, devices and methods, in which like reference characters refer to like parts throughout, and in which.

The invention may be embodied in several forms without departing from its spirit or essential characteristics. The scope of the invention is defined in the appended claims, rather than in the specific description preceding them. All embodiments that fall within the meaning and range of equivalency of the claims are therefore intended to be embraced by the claims.

DETAILED DESCRIPTION

Reference will now be made to exemplary embodiments, examples of which are illustrated in the accompanying drawings. It is to be understood that other embodiments may be utilized and structural and functional changes may be made. Moreover, features of the various embodiments may be combined or altered. As such, the following description is presented by way of illustration only and should not limit in any way the various alternatives and modifications that may be made to the illustrated embodiments. In this disclosure, numerous specific details provide a thorough understanding of the subject disclosure. It should be understood that aspects of this disclosure may be practiced with other embodiments not necessarily including all aspects described herein, etc.

As used herein, the words "example" and "exemplary" mean an instance, or illustration. The words "example" or "exemplary" do not indicate a key or preferred aspect or embodiment. The word "or" is intended to be inclusive rather an exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

Figure 1:
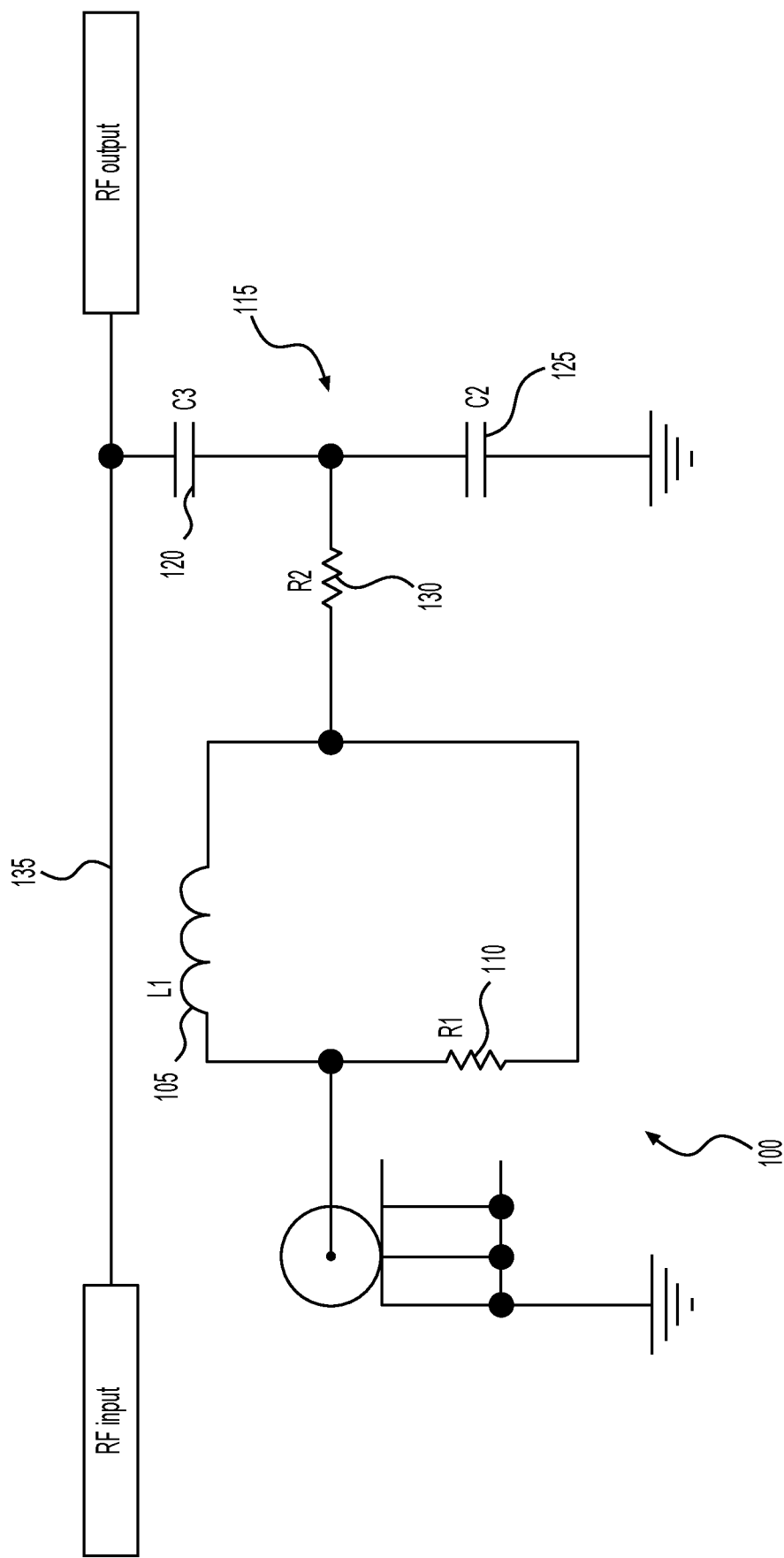
FIG. 1 shows a schematic of a conventional directional coupler circuit.

FIG. 1 shows a conventional directional coupler circuit 100. When in operation, the coil 105 (L1) is loaded down with first resistor (110) R1 which can be small, but still limits the bandwidth of the coupler circuit 100. Similarly, the voltage divider 115 is comprised of air gap capacitor 120 (C3) and capacitor 125 (C2) is unloaded by second resistor 130 (R2), but it is usually small value or shorted out which requires capacitor 125 (C2) to be large and yet still limits the bandwidth because the coupling will change with frequency. Further, the entire directional coupler circuit 100 would need to be duplicated if one wishes to measure RF power flowing in both directions on the transmission line 135.

Thus, as can be seen, if a conventional directional coupler circuit 100 has good directivity then it also has a narrow frequency range. Conversely, if the frequency range of the directional coupler circuit 100 is wide, the coupling will also change a significant amount. Therefore, the common practice is to limit the frequency range for which a conventional directional coupler circuit 100 can be used if a constant coupling factor is needed.

Further, if the directivity is good, often a ferrite material must be used to make the frequency bandwidth wide. The ferrite however limits the power range of the signal being measured because either the signal loss is too high and high power signals cause too much heat in the ferrite core, or non-linearity of the ferrite due to hysteresis cause changes in the mutual inductance.

Additionally, at low frequencies, the capacitive coupling of directional couplers needs to be large to couple enough signal to measure power. If the power levels are high, then the voltage that the capacitors need to handle are also high, which requires the use of expensive high voltage capacitors with expensive temperature stable dielectrics.

However, at low frequencies the inductive coupling of directional couplers needs to be physically large due to the large amounts of turns required to couple enough signal. This leads to very expensive and fragile coils that are impractical to make.

Figure 2:
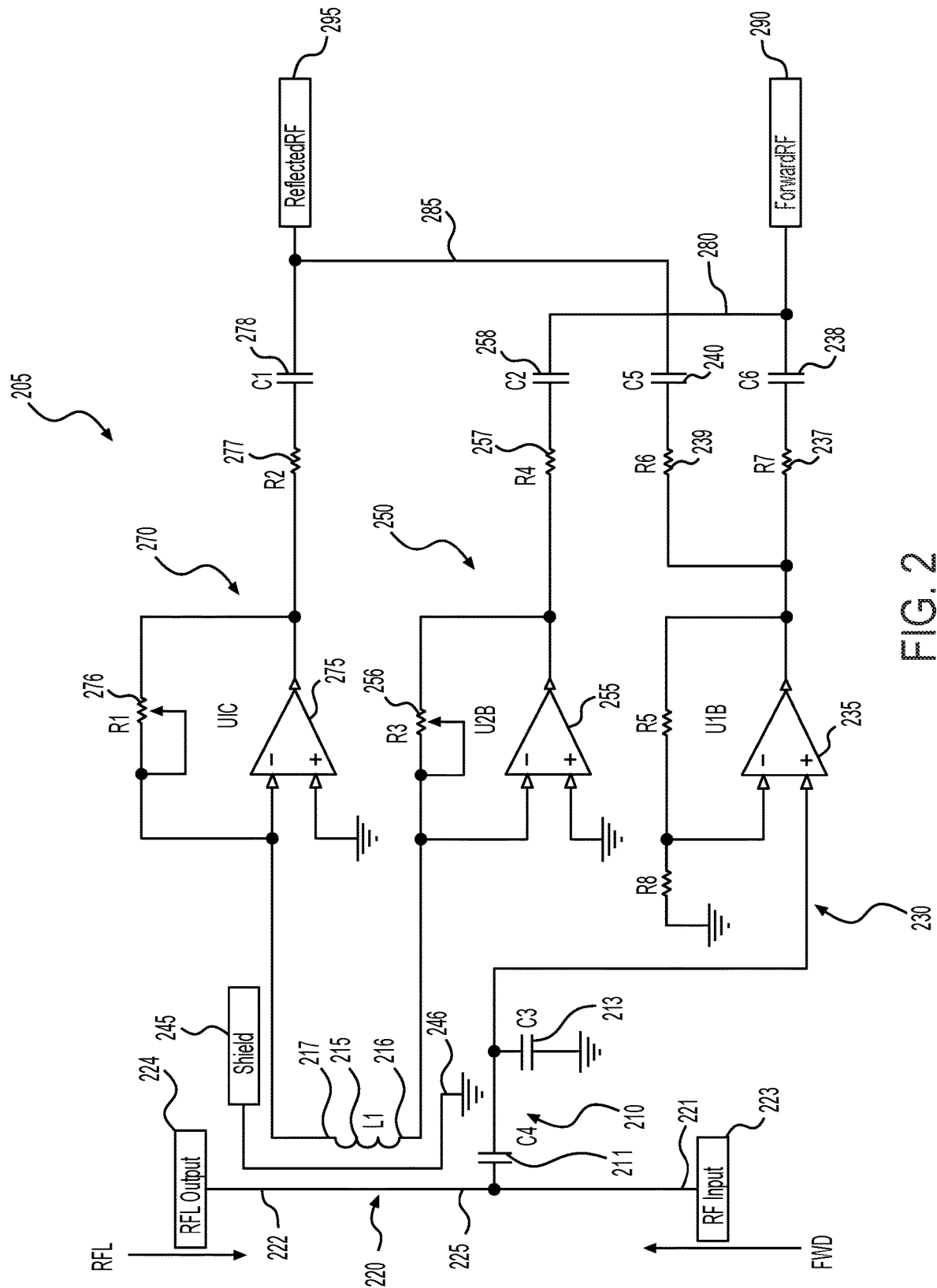
FIG. 2 shows a schematic of a directional coupler circuit in accordance with an exemplary embodiment of the invention.
Figure 3A:
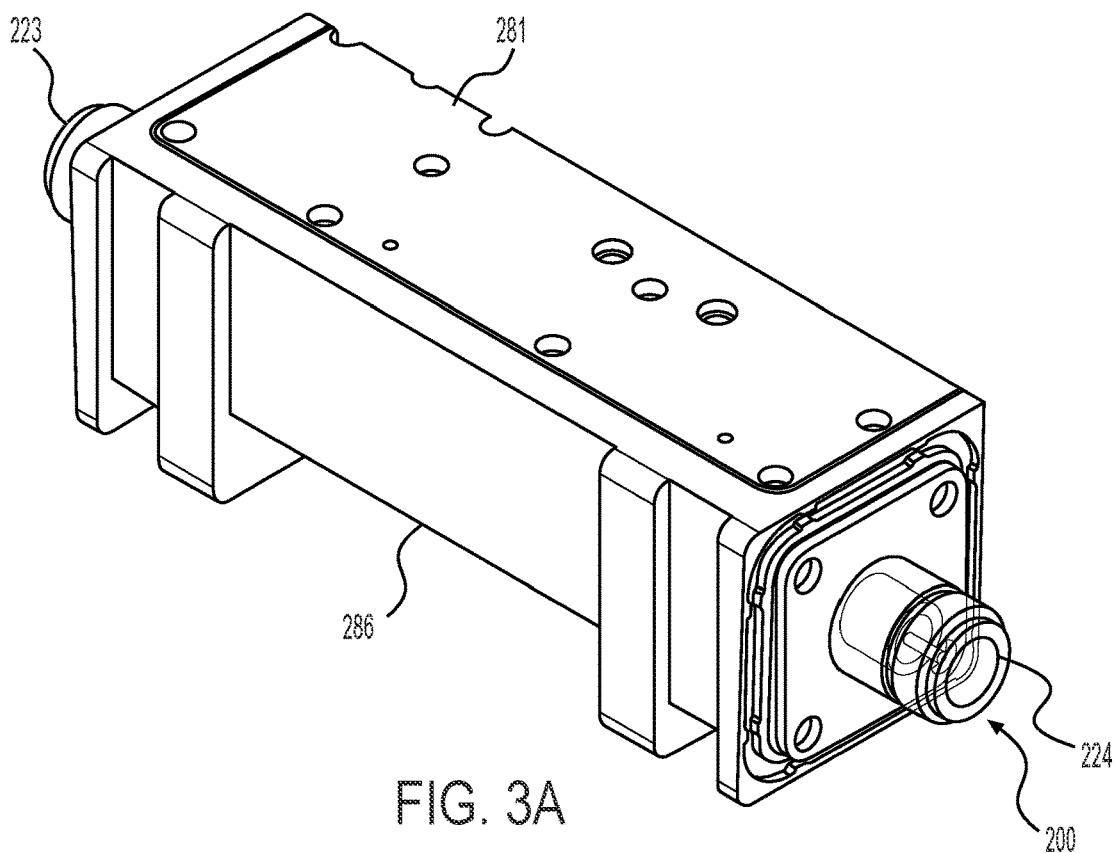
FIGS. 3A-G shows an example of a directional coupler in accordance with an exemplary embodiment of the invention.
Figure 3B:
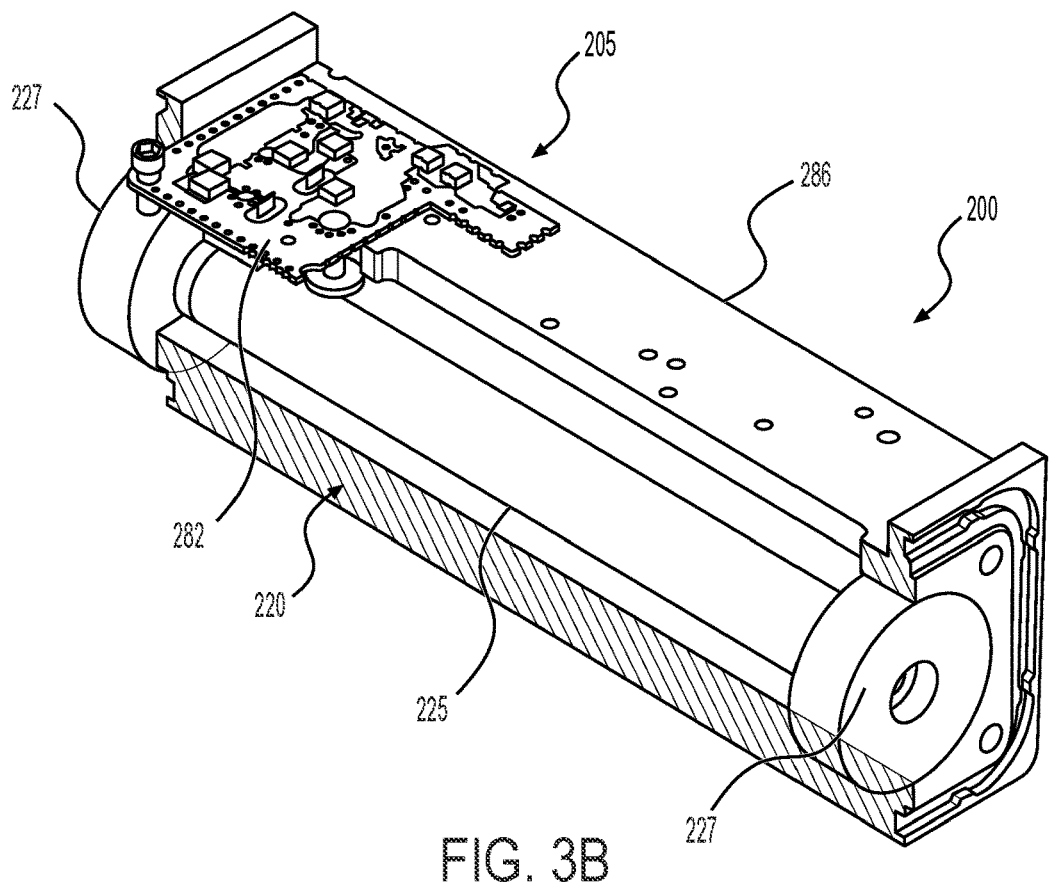
Figure 3C:
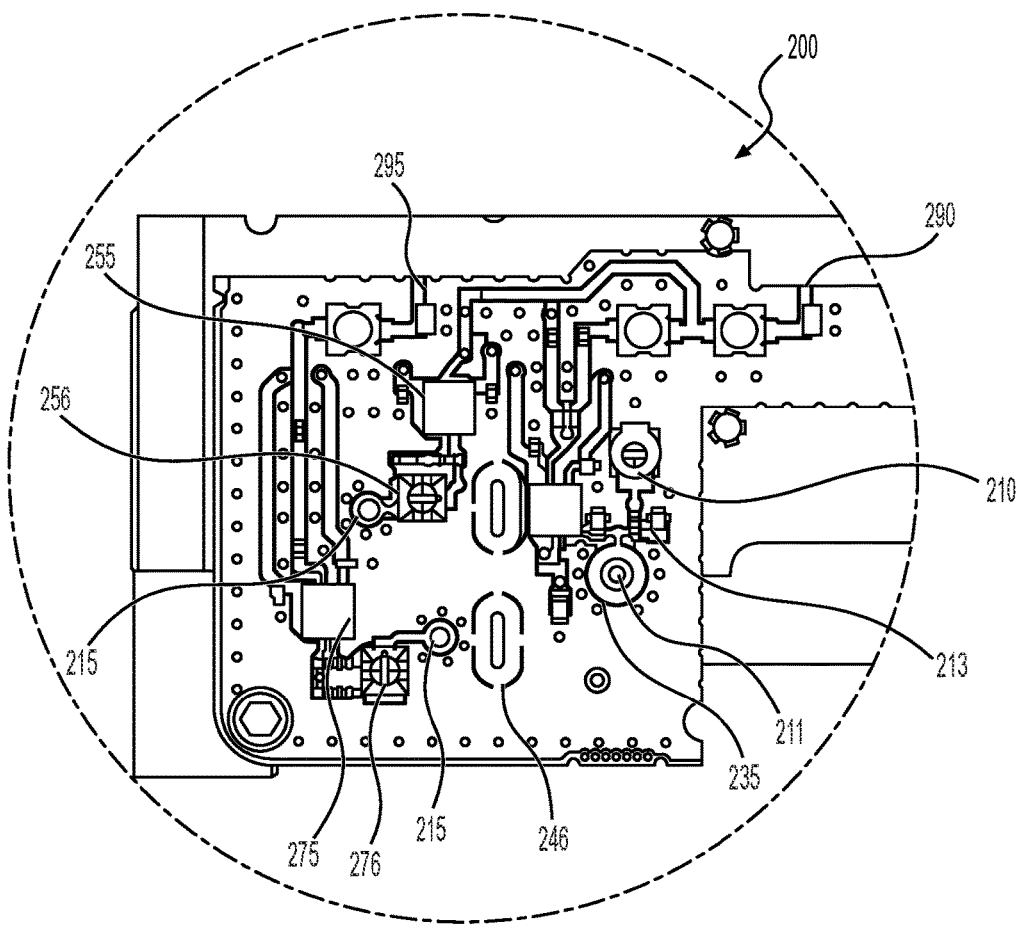
Figure 3D:
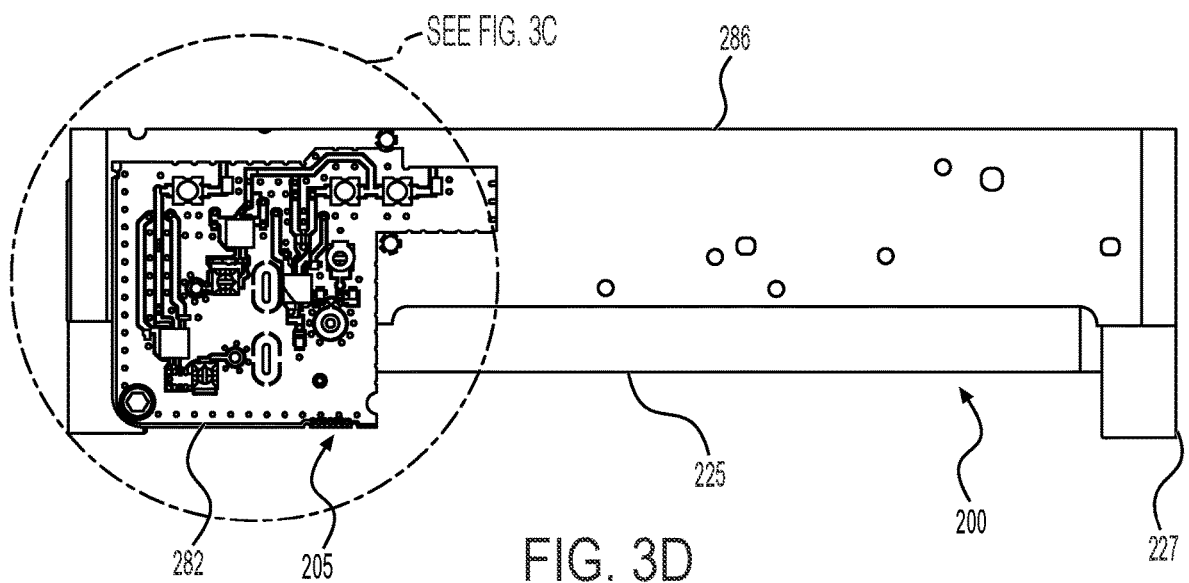
Figure 3E:
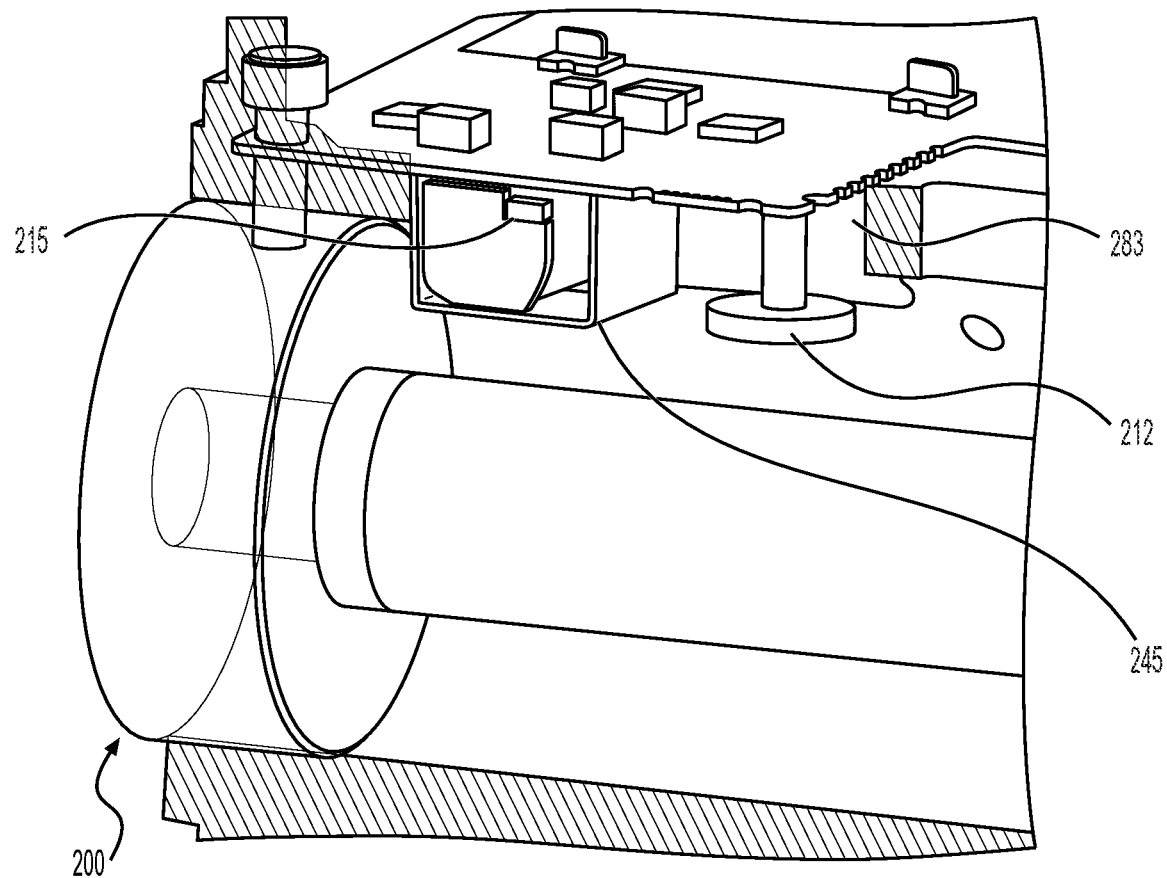
Figure 3F:
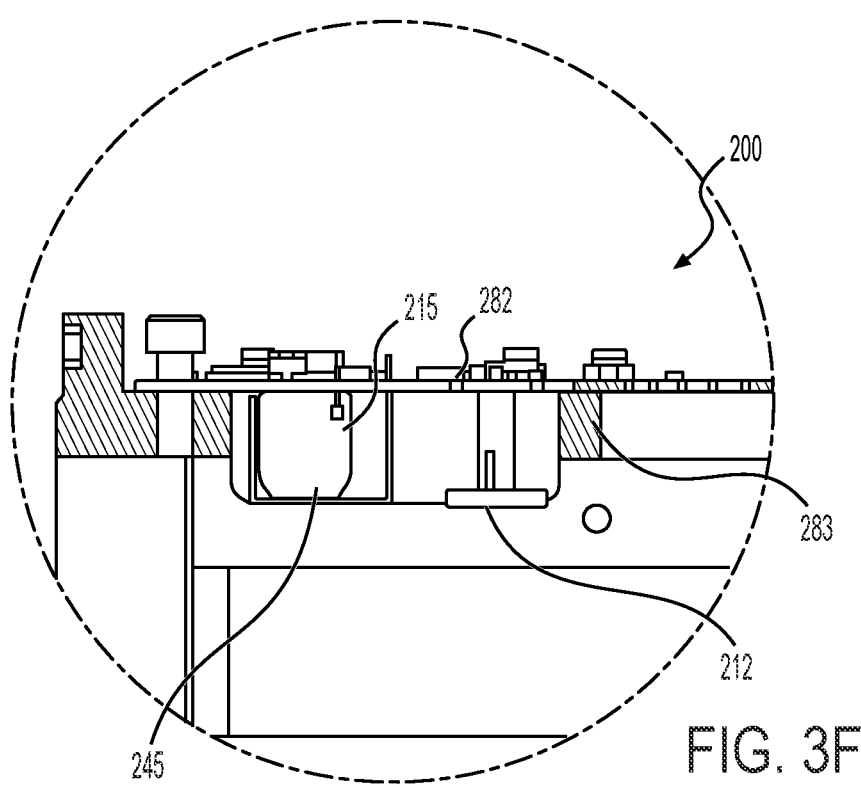
Figure 3G:
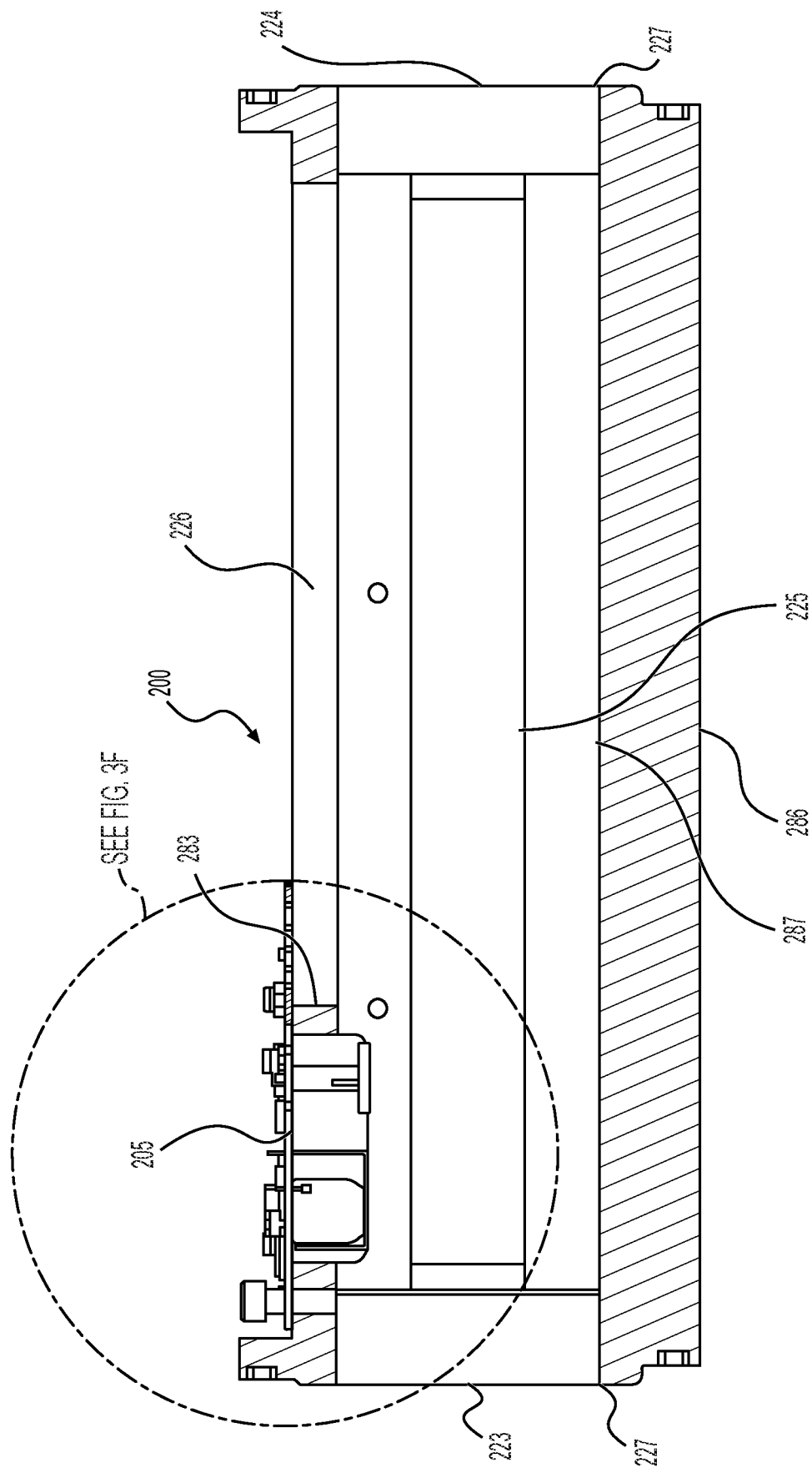

The circuit 205 of directional coupler 200 of FIGS. 2-3G addresses the issues with conventional directional couplers 100 described above in two ways. The first is by the use of the voltage operational amplifier 235 that unloads the capacitive voltage divider 210. The second is using forward and reflected transimpedance operational amplifier circuits to provide a short circuit to the coupling coil 215, namely a forward direction current sample circuit 250 having a forward transimpedance operational amplifier 255 and a reflected direction current sample circuit 270 having a reflected transimpedance operational amplifier 275. The coil 215 can be a single coil or multiple coils. Both of these improvements in the directional coupler 200 design of FIG. 2 greatly expand the frequency range of the directional coupler 200, especially on the low frequency end of the range, while still allowing high power limited only by the RF transmission line 220.

Thus, disclosed herein is a directional coupler 200 that can measure the power in a coaxial transmission line 220 in both the forward (downstream) and reflected (upstream) directions. The directivity, the ability of the circuit 205 to separate the forward and reflected power, is extremely good. The coupling flatness is also very good, which means the coupling changes very little over the frequency range of the directional coupler circuit 205.

The directional coupler circuit 205 of FIG. 2 is comprised of a capacitive divider 210, which samples the voltage on the transmission line 220 (electric field on the transmission line 220). The capacitive divider 210 is comprised for a first capacitor 211 (C4) and a second capacitor 213 (C3). The first capacitor 211 can be an airgap capacitor formed by the center conductor 225 of transmission line 220 and a metal disk 212 of first capacitor 211. The first capacitor 211 is electrically connected with the second capacitor 213. The second capacitor 213 may be comprised of one or more capacitors, one of which may be variable. Directional coupler circuit 205 also has a coil 215 (L1) which has mutual inductance to the center conductor 225 of transmission line 220 to sample the current travelling in both the forward and reflected directions on transmission line 220. Coil 215 has an upstream end 216 and a downstream end 217. Transmission line 220 has an upstream end 221 and a downstream end 222. The upstream end 221 of transmission line 220 is electrically connected with an RF input 223 of transmission line 220 and the downstream end 222 of transmission line 220 is electrically connected with an RF output 224 of transmission line 220.

A voltage sample circuit 230 is comprised of a voltage operational amplifier 235 (U1B) that is electrically connected with and provides high impedance to the capacitive divider 210.

A forward direction current sample circuit 250 is comprised of a forward transimpedance operational amplifier 255 (U2B) that is electrically connected to and provides low impedance to the coil 215. The inverting input of forward transimpedance operational amplifier 255 is electrically connected to the upstream end 216 of coil 215. The non-inverting input of forward transimpedance operational amplifier 255 is electrically connected to ground.

A reflected direction current sample circuit 270 is comprised of a reflected transimpedance operational amplifier 275 (U1C) that is electrically connected to and provides low impedance to the coil. The inverting input of reflected transimpedance operational amplifier 275 is electrically connected to the downstream end 217 of coil 215. The non-inverting input of reflected transimpedance operational amplifier 275 is electrically connected to ground.

A variable gain network to adjust the gains of forward transimpedance operational amplifier 255 and reflected transimpedance operational amplifier 275 using the feedback resistor 256 (R3) of forward transimpedance operational amplifier 255 and the feedback resistor 276 (R1) of reflected transimpedance operational amplifier 275, such that the directivity of the directional coupler circuit 205 is optimized.

A combined forward path 280 configured to combine the voltage sample and current sample from the transmission line 220 in such a way to enable directivities greater than about 30 dB, and a 50 ohm output impedance in the forward direction using forward transimpedance operational amplifier coupling resistor 257 (R4), voltage operational amplifier forward coupling resistor 237 (R7), forward transimpedance operational amplifier coupling capacitor 258 (C2), and voltage operational amplifier forward coupling capacitor 238 (C6). The combined forward path 280 is comprised of the forward transimpedance operational amplifier 255 electrically connected to the coil 215. The forward transimpedance operational amplifier 255 receives a sample of the current travelling on the transmission line 220 from the upstream end 216 of the coil 215 (upstream sample). This upstream sample of current will include both the forward and reflected currents on transmission line 220, but the forward current will be in phase with the voltage sample, described below and obtained using the capacitive voltage divider 210, and the reflected current will be 180 degrees out of phase with the voltage sample. The forward transimpedance operational amplifier 255 outputs a voltage representative of the current travelling on the transmission line 220. The combined forward path 280 also includes the voltage operational amplifier 235 which receives a sample of the voltage on the transmission line 220 from the capacitive voltage divider 210 through the non-inverting input of voltage operational amplifier 235 and outputs a voltage representative of the forward and reflected voltage on the transmission line 220, but unlike the current sample, described above and obtained using the coil 215, the forward and reflected voltage on the transmission line 220 are in phase with each other. The combined forward path 280 combines the output of the forward transimpedance operational amplifier 255 of the forward direction current sample circuit 250 and the output of the voltage operational amplifier 235 of the voltage sample circuit 230 and provides the combined output to the forward RF power output 290.

Since the reflected current and voltage signals are out of phase with each other and if the reflected signals are balanced between the current and voltage sample, they will cancel out and the signal (voltage) at forward RF power output 290 will only be representative of the RF power of the signal travelling in the forward direction on the transmission line 220. The voltage output at the forward RF power output 290 is representative of the RF power of the signal travelling in the forward direction on the transmission line 220 because the RF power can be directly calculated from the voltage representation of the sample of forward current on transmission line 220 using Ohm's law. In some embodiments of the combined forward path 280, the outputs from the forward transimpedance operational amplifier 255 and voltage operational amplifier 235 are added together and AC coupled to remove any DC offset introduced by the operational amplifiers using forward transimpedance operational amplifier coupling resistor 257 (R4), voltage operational amplifier forward coupling resistor 237 (R7), forward transimpedance operational amplifier coupling capacitor 258 (C2), and voltage operational amplifier forward coupling capacitor 238 (C6) prior to being provided to the forward RF power output 290.

More specifically, the output of the forward transimpedance operational amplifier 255 (reflected current on transmission line 220) cancels the reflected RF power component in the output of the voltage operational amplifier 235 (reflected voltage on transmission line 220) because they are out of phase by 180 degrees and equal in magnitude, thereby leaving only the forward RF power component at the forward RF power output 290 of the forward path of the directional coupler circuit 205. Therefore, a voltage representative of RF power travelling in the forward direction on the transmission line 220 is present at the forward RF power output 290. More specifically, the voltage present at the output of the forward RF power output 290 is proportional to the square root of the RF power flowing in the forward direction on transmission line 220. In an embodiment, the voltage present at the output of the forward RF power output 290 can range from about 0-5 VDC. However, it is contemplated that a person having ordinary skill in the art can choose another voltage range to be produced at the output of the forward RF power output 290 to represent the full scale forward RF power on transmission line 220.

A combined reflected path 285 configured to combine the voltage sample and current sample from the transmission line 220 in such a way to enable directivities greater than 30 dB, and a 50 ohm output impedance in the reflected direction using reflected transimpedance operational amplifier coupling resistor 277 (R2), voltage operational amplifier reflected coupling resistor 239 (R6), reflected transimpedance operational amplifier coupling capacitor 278 (C1), and voltage operational amplifier reflected coupling capacitor 240 (C5). The combined reflected path 285 is comprised of the reflected transimpedance operational amplifier 275, electrically connected to the coil 215. The reflected transimpedance operational amplifier 275 receives a sample of the current travelling on the transmission line 220 from the downstream end 217 of the coil 215 (downstream sample). This downstream sample of current will include both the forward and reflected currents on transmission line 220, but the reflected current will be in phase with the voltage sample, described below and obtained using the capacitive voltage divider 210, and the forward current will be 180 degrees out of phase with the voltage sample. The reflected transimpedance operational amplifier 275 outputs a voltage representative of the current travelling on the transmission line 220. The combined reflected path 285 also includes the voltage operational amplifier 235, which receives a sample of the voltage on the transmission line 220 from the capacitive voltage divider 210 through the non-inverting input of voltage operational amplifier 235 and outputs a voltage representative of the forward and reflected voltage on the transmission line 220. Unlike the current sample, described above and obtained using the coil 215, the forward and reflected voltage on the transmission line 220 are in phase with each other. The combined reflected path 285 combines the output of the reflected transimpedance operational amplifier 275 of the reflected direction current sample circuit 270 and the output of the voltage operational amplifier 235 of the voltage sample circuit 230 and provides the combined output to the reflected RF power output 295.

Since the forward current and voltage signals are out of phase with each other and if the forward signals are balanced between the current and voltage sample, they will cancel out and the signal (voltage) at reflected RF power output 295 will only be representative of the RF power of the signal travelling in the reflected direction on the transmission line 220. The voltage output at the reflected RF power output 295 is representative of the RF power of the signal travelling in the reflected direction on the transmission line 220 because the RF power can be directly calculated from the voltage representation of the sample of reflected current on transmission line 220 using Ohm's law. In some embodiments of the combined reflected path 285, the outputs from the reflected transimpedance operational amplifier 275 and voltage operational amplifier 235 are added together and AC coupled to remove any DC offset introduced by the operational amplifiers using reflected transimpedance operational amplifier coupling resistor 277 (R2), voltage operational amplifier reflected coupling resistor 239 (R6), reflected transimpedance operational amplifier coupling capacitor 278 (C1), and voltage operational amplifier reflected coupling capacitor 240 (C5) prior to being provided to the reflected RF power output 295.

More specifically, the output of the reflected transimpedance operational amplifier 275 (forward current on transmission line 220) cancels the forward RF power component in the output of the voltage operational amplifier 235 (forward voltage on transmission line 220) because they are out of phase by 180 degrees and equal in magnitude, thereby leaving only the reflected RF power component at the reflected RF power output 295 of the reflected path of the directional coupler circuit 205. Therefore, a voltage representative of RF power travelling in the reflected direction on the transmission line 220 is present at the reflected RF power output 295. More specifically, the voltage present at the output of the reflected RF power output 295 is proportional to the square root of the RF power flowing in the reflected direction on transmission line 220. In an embodiment, the voltage present at the output of the reflected RF power output 295 can range from about 0-5 VDC. However, it is contemplated that a person having ordinary skill in the art can choose another voltage range to be produced at the output of the reflected RF power output 295 to represent the full scale reflected RF power on transmission line 220.

Directional coupler circuit 205 is further comprised of a shield 245 to keep the current sample from coupling to the voltage sample grounded on only one side to still allow for magnetic coupling to the center conductor 225 of transmission line 220. The shield 245 is sized and positioned to obstruct direct line of sight between the coil 215 and transmission line 220, which prevents the electric field from coupling with coil 215, while permitting the magnetic field of the center conductor 225 of transmission line 220 to flow around the shield 245 and couple with the coil 215. The shield 245 is grounded on a first end 246. The first end 246 that is grounded is located between coil 215 and voltage divider 210.

In FIG. 2, the voltage sample circuit is a voltage divider 210 consisting of two capacitors. The first capacitor 211 (C4) is a parallel plate type capacitor with an air dielectric, with one node being the center conductor 225 of transmission line 220 and the other is a metal disk 212 that can be adjusted up and down to adjust the magnitude of the voltage sample from transmission line 220. The second capacitor 213 (C3) is capacitance to ground to complete the voltage divider of the voltage sample circuit 230. The voltage sample is calculated by:

$$V_s = \frac{C4}{C4+C3} \cdot V \cdot \left(1 + \frac{R5}{R8}\right) \quad (1)$$

Where:
$V_s$ is the voltage sample and mirrored at the output of voltage operational amplifier 235 (U1B); and
V is the voltage on the center conductor 225.

Note that $V_s$ is not dependent on frequency in the directional coupler circuit 205 of FIG. 2. This is unlike traditional directional coupler designs, such as that shown in FIG. 1, which would load down this node with an impedance that would make the voltage sample dependent on frequency and the bandwidth of the traditional directional coupler will be limited. Additionally, if C4<<C3 then the equation becomes:

$$V_s = \frac{C4}{C3} \cdot V \cdot \left(1 + \frac{R5}{R8}\right)$$

or simply $V_s = V \cdot G_V$ (2)
where $$G_V = \frac{C4}{C3} \cdot \left(1 + \frac{R5}{R8}\right)$$

In some embodiments, the ratio of C4 to C3 can be about 10 to 1 allowing for wide frequency bandwidth and flat RF power coupling.

Further, in FIG. 2, the current sample of RF power travelling on transmission line 220 is obtained by coupling the center conductor 225 of transmission line 220 with the coil 215 L1. Circuit theory dictates that:

$$\frac{I_s}{I} = \frac{j\omega M}{2 \cdot R + j\omega L1} \quad (3)$$

Where:
I is the current in the center conductor 225;
$I_s$ is the sample current flowing through coil 215 (L1);
M is the mutual inductance between the center conductor 225 and coil 215 (L1);
R is the input resistance of the op-amp (either forward transimpedance operational amplifier 255 (U2B) or reflected transimpedance operational amplifier 275

(U1C), depending upon whether the forward or reflected current is being sampled on transmission line 220); and ω is the frequency of the signal being measured on transmission line 220.

The input impedance of forward transimpedance operational amplifier 255 (U2B) and reflected transimpedance operational amplifier 275 (U1C) are both nearly 0 ohms, thus R is nearly 0 and both sides of the upstream end 216 and downstream end 217 of coil 215 (L1) are terminated into nearly 0 ohms. Because of this the equation for reduces to:

$$\frac{I_s}{I} = \frac{M}{L1} \quad (4)$$

Note that the equation is no longer frequency dependent. Thus, the current sampling by coil 215 of RF power travelling on transmission line 220 is not frequency dependent in directional coupler circuit 205.

This is unlike the traditional directional coupler designs, such as that of FIG. 1, which load the coil 105 (L1) with a non-zero impedance that make the current sample frequency dependent further limiting the useful frequency range of the coupler 100.

The current sample obtained by coil 215 is then turned into a voltage by forward transimpedance operational amplifier 255 (U2B) and reflected transimpedance operational amplifier 275 (U1C).

As was stated above, the forward transimpedance operational amplifier 255 (U2B) and reflected transimpedance operational amplifier 275 (U1C) convert the current $I_s$ into a voltage. Since the gain of the transimpedance amplifier is negative and where the forward transimpedance operational amplifier 255 (U2B) has a feedback resistor 256 (R3) and the reflected transimpedance operational amplifier 275 (U1C) has a feedback resistor 276 (R1) we get from circuit theory:

$$V_{f1} = R3 \cdot I_s \quad (5)$$

and $$V_{f2} = -R1 \cdot I_s \quad (6)$$

Where:

$V_{f1}$ is the voltage at the output of forward transimpedance operational amplifier 255 (U2B); and $V_{f2}$ is the voltage at the output of reflected transimpedance operational amplifier 275 (U1C).

Substituting (4) we Get:

$$V_{f1} = R3 \cdot \frac{M}{L1} \cdot I \quad (7)$$

and $$V_{f2} = -R1 \cdot \frac{M}{L1} \cdot I \quad (8)$$

Further, in FIG. 2, when combining the voltage sample and current samples from transmission line 220 using coil 215 and voltage divider 210 and output by the forward transimpedance operational amplifier 255 and voltage operational amplifier 235, the equation for voltage and current along a transmission line is:

$$V = V1 \cdot e^{\alpha x} \cdot e^{j(\omega t + \beta x)} + V2 \cdot e^{-\alpha x} \cdot e^{j(\omega t - \beta x)} \quad (9)$$

$$I = \frac{V1}{Z} \cdot e^{\alpha x} \cdot e^{j(\omega t + \beta x)} - \frac{V2}{Z} \cdot e^{-\alpha x} \cdot e^{j(\omega t - \beta x)} \quad (10)$$

Where:

V is the voltage on the center conductor 225;

I is the current on the center conductor 225;

V1 is the voltage in the forward direction on transmission line 220

V2 is the voltage in the opposite direction on transmission line 220

Z is the characteristic impedance of the transmission line 220 (usually 50 ohms)

ω is the frequency of the signal on transmission line 220

α, β are the attenuation and phase constant respectively

After being outputted from the forward transimpedance operational amplifier 255 and voltage operational amplifier 235, the voltage and current samples in the forward direction are added together and AC coupled using forward transimpedance operational amplifier coupling resistor 257 (R4), voltage operational amplifier forward coupling resistor 237 (R7), forward transimpedance operational amplifier coupling capacitor 258 (C2), and voltage operational amplifier forward coupling capacitor 238 (C6) giving the equation:

$$V_f \propto V_s + V_{f1}$$

substituting (2) for $V_s$, (7) for $V_{f1}$ we get $$V_f \propto G_V \cdot V + R3 \cdot \frac{M}{L1} \cdot I$$

$$Vf \propto G_V \cdot \left(V1 \cdot e^{\alpha x} \cdot e^{j(\omega t + \beta x)} + V2 \cdot e^{-\alpha x} \cdot e^{j(\omega t - \beta x)}\right) +$$

$$R3 \cdot \frac{M}{L1 \cdot Z} \cdot \left(V1 \cdot e^{\alpha x} \cdot e^{j(\omega t + \beta x)} - V2 \cdot e^{-\alpha x} \cdot e^{j(\omega t - \beta x)}\right)$$

If $G_V = R3 \cdot \frac{M}{L1 \cdot Z}$ then we get:

$$Vf \propto 2 \cdot G_V \cdot V1 \cdot e^{\alpha x} \cdot e^{j(\omega t + \beta x)}$$

Which is the voltage in the forward direction on transmission line 220. Notice that the term $V2 \cdot e^{-\alpha x} \cdot e^{j(\omega t - \beta x)}$ represents the reflected signal and cancels out.

And similarly, after being outputted from the reflected transimpedance operational amplifier 275 and voltage operational amplifier 235, the voltage and current samples in the reflected direction are added together and AC coupled using reflected transimpedance operational amplifier coupling resistor 277 (R2), voltage operational amplifier reflected coupling resistor 239 (R6), reflected transimpedance operational amplifier coupling capacitor 278 (C1), and voltage operational amplifier reflected coupling capacitor 240 (C5) giving the equation:

$$V_r \propto V_s + V_{f2}$$

substituting (2) for $V_s$, (8) for $V_{f2}$ we get $$V_r \propto G_V \cdot V + R1 \cdot \frac{M}{L1} \cdot I$$

$$V_r \propto G_V \cdot \left(V1 \cdot e^{\alpha x} \cdot e^{j(\omega t + \beta x)} + V2 \cdot e^{-\alpha x} \cdot e^{j(\omega t - \beta x)}\right) -$$

$$R1 \cdot \frac{M}{L1 \cdot Z} \cdot \left(V1 \cdot e^{\alpha x} \cdot e^{j(\omega t + \beta x)} - V2 \cdot e^{-\alpha x} \cdot e^{j(\omega t - \beta x)}\right)$$

-continued

If $G_V = R1 \cdot \dfrac{M}{L1 \cdot Z}$ then we get:

$$V_r \propto 2 \cdot G_V \cdot V2 \cdot e^{-\alpha x} \cdot e^{j(\omega t - \beta x)}$$

Which is the voltage traveling in the reflected direction on transmission line 220. Notice that the term $V1 \cdot e^{\alpha x} \cdot e^{j(\omega t+\beta x)}$ represents the forward signal and cancels out.

Further, the directional coupler circuit 205 of FIG. 2 can be tuned. In an embodiment, the directional coupler circuit 205 can be tuned by using variable resistors and capacitors for reflected transimpedance operational amplifier feedback resistor 276 (R1), forward transimpedance operational amplifier feedback resistor 256 (R3) and first capacitor 211 (C4) or second capacitor 213 (C3) of the capacitive voltage divider 210, the directional coupler circuit 205 can be tuned to satisfy the equations $$G_V = R1 \cdot \dfrac{M}{L1 \cdot Z}$$

and $$G_V = R3 \cdot \dfrac{M}{L1 \cdot Z}$$

and get good directivity and coupling over a very large frequency range. Additionally, by limiting the range over which reflected transimpedance operational amplifier feedback resistor 276 (R1), forward transimpedance operational amplifier feedback resistor 256 (R3) and second capacitor 213 (C3) can be adjusted, the tuning can be done easily and quickly.

In exemplary embodiments, reflected transimpedance operational amplifier feedback resistor 276 (R1) can have a range of about 20-100 ohms and forward transimpedance operational amplifier feedback resistor 256 (R3) can have a range of about 20-100 ohms.

Further, in some embodiments, fixed value resistors and capacitors are added in parallel and series with trimmer capacitors and resistors to help mitigate any temperature drift problems. Stated alternatively, in some embodiments, fixed value resistors are added in parallel and series with reflected transimpedance operational amplifier feedback resistor 276 (R1) and forward transimpedance operational amplifier feedback resistor 256 (R3).

Thus, as can be seen upon review of FIG. 2, the addition of the voltage operational amplifier 235 allows for unloading the voltage divider circuit 210. Further, the addition of the operational amplifier circuit permits the use of low value capacitors and still provides flat coupling response at low frequencies. The addition of the voltage operational amplifier 235 permits the use of low value capacitors for the voltage divider 210. The addition of the operational amplifier circuit permits the direct conversion of the current sample to a voltage. The addition of the forward transimpedance operational amplifier 255 permits the direct conversion of the current travelling in the forward direction on transmission line 220 using coil 215. The addition of the reflected transimpedance operational amplifier 275 permits the direct conversion of the current travelling in the reflected direction on transmission line 220 using coil 215.

Further, the addition of the transimpedance amplifier circuit to directly convert the current sample to a voltage allows the use of small RF coils even at low RF frequencies. The addition of the forward transimpedance operational amplifier 255 and reflected transimpedance operational amplifier 275 to directly convert the current sample provided by coil 215 to voltage allows for the use of small RF coils, such as coils with as few as about 10 turns, even at low frequencies, such as, about 100 KHz. The addition of the forward transimpedance operational amplifier 255, reflected transimpedance operational amplifier 275, and voltage operational amplifier 235 permit the voltage and current samples to combine without interfering with each other.

Also, the addition of the shield 245 permits the isolation of the current sample from the voltage sample. The addition of trimmer components permits for easier tuning of the circuit. The addition of a variable reflected transimpedance operational amplifier feedback resistor 276 (R1), forward transimpedance operational amplifier feedback resistor 256 (R3), first capacitor 211 (C4) and/or second capacitor 213 (C3) permits for easier tuning of the circuit. The op-amps' ability to load and unload the current and voltage sample permit the increased frequency range. The forward transimpedance operational amplifier 255, reflected transimpedance operational amplifier 275, and voltage operational amplifier 235 ability to load and unload the current and voltage sample permit the increased frequency range of the directional coupler circuit 205. The op-amp circuits permit the frequency range of the directivity and coupling to be extended. The forward transimpedance operational amplifier 255, reflected transimpedance operational amplifier 275, and voltage operational amplifier 235 permit the frequency range of the directivity and coupling of the directional coupler circuit 205 to be extended.

Further, a single coil 215 is used for sensing current in both the forward and reflected directions on transmission line 220. A single coil 215 is used to measure both the forward and reflected power in a transmission line 220. The coupling level of the directional coupler circuit 205 can be easily changed by only changing the gain of the forward transimpedance operational amplifier 255 and reflected transimpedance operational amplifier 275 without having to change the RF circuit components, which often require a lot of care. The shield 245 on the coil 215 prevents voltage coupling to the center conductor 225.

FIGS. 3A-G show an embodiment of a directional coupler 200 in accordance with an embodiment of this invention. The directional coupler 200 includes a housing 286, cover 281, directional coupler circuit printed circuit board assembly 282, center conductor 225, and insulating supports 227. The RF signal to be measured is introduced through the RF input 223 of transmission line 220. Transmission line 220 is a coaxial structure having a nominal impedance of 50 ohms. The RF input 223 may have a "Quick-change" (QC) style connector to common RF interface types such as N, UHF, TNC, DIN, etc. The RF signal propagates through a high electrical conductivity section of transmission line 220 comprised of an outer conductor 226 formed by a circular bore 287 in the housing 286 and a center conductor 225 formed by a cylindrical rod held concentrically inside the bore by two non-electrical conducting supports (insulating supports 227). The RF signal remains as a classical transverse electromagnetic (TEM) mode such that the Electric field lines are radial from the center conductor 225 to the outer conductor 226 and the Magnetic field lines are concentric around the center conductor 225. The RF signal exits the embodiment via the RF output 224. The physical construction of the directional coupler 200 presents a characteristic impedance of 50 ohms and very low insertion loss such that the embodiment is impedance matched to the source and little to no signal is lost (i.e. attenuated) as it travels through the section of transmission line 220 in directional coupler 200.

The directional coupler circuit 205 shown & described previously in FIG. 2 is constructed using standard surface and through-hole mounted printed circuit board assembly methods. A multi-layer printed circuit board 282 is populated with components described in FIG. 2 and placed outside the outer conductor 226 and center conductor 225 and outside of the RF signal path in the transmission line section 220. A sample hole 283 is cut through a portion of the outer conductor 226 (Housing) to allow the voltage divider 210 and coil 215 access to the electric and magnetic fields in the transmission line 220, respectively.

The voltage divider 210 is comprised of two or more capacitors. The first capacitor 211 (C4) is a parallel plate type capacitor with an air dielectric and one node being the center conductor 225 and the other is a metal disk 212 that can be adjusted up and down to adjust the magnitude of the voltage sample. Capacitive coupling is created from the center conductor 225 and metal disk 212 creating two plates of a capacitor with air as the dielectric and the electric field, being radial from the center conductor 225. Non-conducting materials of higher dielectric constant may be may also be inserted between the center conductor 225 and metal disk 212 to enhance the capacitance. The metal disk 212 may be of any size and shape and may be flat or curved to follow the outer diameter of the center conductor 225. The second capacitor(s) 213 (C3) is/are capacitance to ground to complete the voltage divider. The second capacitor(s) 213 may also include a variable or tunable capacitor to adjust the divide ratio. The divided voltage sample is fed to voltage operational amplifier 235 (U1B) as discussed previously.

The coil 215 can be a wire-wound inductor (L1) coupled to the center conductor 225. The magnetic field present in the section of transmission line 220 is proportional to the current present in the section of transmission line 220. Through mutual inductance, a current is generated in the coil 215. The coil 215 maybe be of arbitrary shape and arbitrary number of windings and may or may not have a magnetic enhancing core. The orientation and position of the coil 215 relative to the center conductor 225 can be varied to determine the current coupling. As previously discussed, since the current in the center conductor 225 can be in both the forward and reflected direction, the current sample in the forward direction on transmission line 220 will be sampled by the coil 215 (L1) and sent to forward transimpedance operational amplifier 255 (U2B). Conversely, the current in the reflection direction on transmission line 220 will be sampled by the coil 215 (L1) and sent to reflected transimpedance operational amplifier 275 (U1C). The forward RF power output 290 and reflected RF power output 295 may be presented to additional circuit elements to adjust the dynamic range, frequency response or harmonic filtering.

Figure 4:
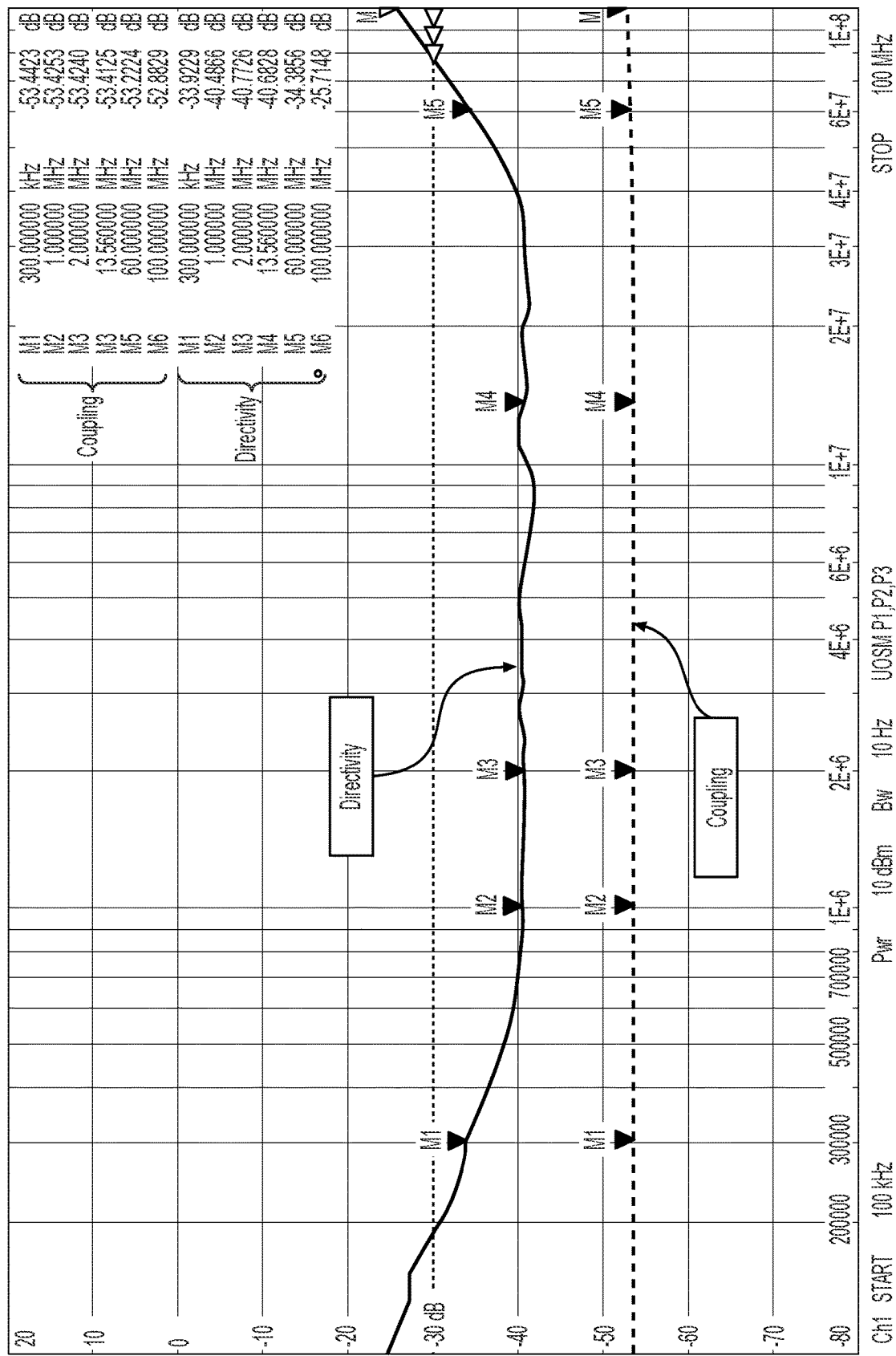
FIG. 4 shows a plot of the directivity and coupling of a conventional directional coupler circuit and a directional coupler circuit in accordance with an exemplary embodiment of the invention.

FIG. 4 is a graph showing the performance of the directional coupler circuit 205 of FIGS. 2-3G. Upon review, it can be seen that there is about a 5% variation in coupling and directivity is better than 33 dB from 300 KHz to 60 MHz, a 200:1 frequency range. When comparing the performance of the directional coupler circuit 205 of FIGS. 2-3G to that of a 400 KHz sensor from Bird Technologies Group which uses a conventional directional coupler circuit 100, the variation in coupling from just 330 KHz to 440 KHz is 30% and the directivity is about the same, which is just over a 1.33:1 frequency range. Thus, the directional coupler 200 having directional coupler circuit 205 of FIGS. 2-3G has been shown to have a 150× improvement in frequency range, when compared to that of a conventional directional coupler circuit 100. Therefore, the directional coupler 200 of FIGS. 2-3G has a substantial improvement in frequency range without compromising directivity, when compared to conventional directional coupler circuits 100.

What has been described above includes examples of the present specification. It is, of course, not possible to describe every conceivable combination of components or methodologies for purposes of describing the present specification, but one of ordinary skill in the art may recognize that many further combinations and permutations of the present specification are possible. Each of the components or methodologies described above may be combined or added together in any permutation to define the directional coupler, and methods for making thereof. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

The invention claimed is:

1. A directional coupler circuit comprising:
   a capacitive divider for sampling a voltage on a center conductor of a transmission line;
   a coil having mutual inductance with the center conductor for sampling current travelling in a forward direction and a reflected direction on the transmission line, the coil having an upstream end and a downstream end, wherein the coil is configured for sampling current travelling in both the forward direction and the reflected direction on the transmission line;
   a combined forward path comprising a forward transimpedance operational amplifier, a voltage operational amplifier, and a forward RF power output;
      the voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other;
      the forward transimpedance operational amplifier receives an upstream sample of a current travelling on the transmission line from the upstream end of the coil, the upstream sample of current comprising both a current sample travelling in the forward direction and a current sample travelling in the reflected direction on the transmission line; the current sample travelling in the forward direction is in phase with the forward voltage on the transmission line, and the current sample travelling in the reflected direction is equal in magnitude with and 180 degrees out of phase from the sample of the reflected voltage on the transmission line; the forward transimpedance operational amplifier outputs a voltage representative of the upstream sample of current travelling on the transmission line; and
      wherein the outputs of the forward transimpedance operational amplifier and the voltage operational amplifier are combined and outputted using the forward RF power output; when combined, the voltage representation of the current sample travelling in the reflected direction cancels with the sample of the reflected voltage on the transmission line, thereby only a voltage representative of RF power travelling in the forward direction on the transmission line is present at the forward RF power output;

a combined reflected path comprising a reflected transimpedance operational amplifier, a voltage operational amplifier, and a reflected RF power output;

the voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other;

the reflected transimpedance operational amplifier receives a downstream sample of a current travelling on the transmission line from the downstream end of the coil; the downstream sample of current comprising both a current sample travelling in the reflected direction and a current sample travelling in the forward direction on the transmission line; the current sample travelling in the reflected direction is in phase with the reflected voltage on the transmission line and the current sample travelling in the forward direction is equal in magnitude with and 180 degrees out of phase from the sample of forward voltage on the transmission line; reflected transimpedance operational amplifier outputs a voltage representative of the downstream current travelling on the transmission line; and wherein the outputs of the reflected transimpedance operational amplifier and the voltage operational amplifier are combined and outputted using the reflected RF power output; when combined, the voltage representation of the current sample travelling in the forward direction cancels with the sample of the forward voltage on the transmission line, thereby only a voltage representative of RF power travelling in the reflected direction on the transmission line is present at the reflected RF power output.

2. The directional coupler circuit of claim 1, wherein the voltage operational amplifier unloads the capacitive voltage divider, the forward transimpedance operational amplifier provides a short circuit to ground to the upstream end of the coil, and the reflected transimpedance operational amplifier provides a short circuit to ground to the downstream end of the coil, wherein the short circuiting of the coil eliminates the frequency dependence of the coil when sampling current on the transmission line.

3. The directional coupler circuit of claim 1, wherein the capacitive divider is comprised of a first capacitor and at least one second capacitor; the first capacitor is an airgap capacitor formed by the center conductor of the transmission line and a plate.

4. The directional coupler circuit of claim 3, wherein one of the at least one second capacitor is variable.

5. The directional coupler circuit of claim 1, wherein the outputs from the forward transimpedance operational amplifier and voltage operational amplifier are AC coupled prior to being added together; wherein the outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

6. The directional coupler circuit of claim 1, further comprising a shield to isolate the coil from an electric field of the transmission line.

7. The directional coupler circuit of claim 6, wherein the shield is grounded on a single side.

8. The directional coupler circuit of claim 1, wherein the directional coupler circuit can be tuned by using a reflected transimpedance operational amplifier feedback resistor, a forward transimpedance operational amplifier feedback resistor, and/or a first capacitor and a second capacitor of the capacitive voltage divider.

9. The directional coupler circuit of claim 1, wherein the directional coupler circuit has less than about a 10% variation in coupling and a directivity of at least about 30 dB over at least about a 150:1 frequency range.

10. The directional coupler circuit of claim 1, wherein the coil for sampling current travelling in a forward direction and a reflected direction on the transmission line is a single coil.

11. A directional coupler comprising:
a housing having a transmission line and a directional coupler circuit, the transmission line having an RF input at an upstream end and an RF output at a downstream end;

the directional coupler circuit comprising:
a capacitive divider for sampling a voltage on a center conductor of the transmission line,
a coil having mutual inductance with the center conductor for sampling current travelling in a forward direction and a reflected direction on the transmission line, the coil having an upstream end and a downstream end, wherein the coil is configured for sampling current travelling in both the forward direction and the reflected direction on the transmission line;
a combined forward path comprising a forward transimpedance operational amplifier, a voltage operational amplifier, and a forward RF power output;
the voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other;
the forward transimpedance operational amplifier receives an upstream sample of a current travelling on the transmission line from the upstream end of the coil, the upstream sample of current comprising both a current sample travelling in the forward direction and a current sample travelling in the reflected direction on the transmission line; the current sample travelling in the forward direction is in phase with the forward voltage on the transmission line, and the current sample travelling in the reflected direction is equal in magnitude with and 180 degrees out of phase from the sample of the reflected voltage on the transmission line; the forward transimpedance operational amplifier outputs a voltage representative of the upstream sample of current travelling on the transmission line; and wherein the outputs of the forward transimpedance operational amplifier and the voltage operational amplifier are combined and outputted using the forward RF power output; when combined, the voltage representation of the current sample travelling in the reflected direction cancels with the sample of the reflected voltage on the transmission line, thereby only a voltage representative of RF power travelling in the forward direction on the transmission line is present at the forward RF power output;

a combined reflected path comprising a reflected transimpedance operational amplifier, a voltage operational amplifier, and a reflected RF power output;

the voltage operational amplifier receives a sample of the voltage on the transmission line from the capacitive divider and outputs a voltage representative of the voltage on the transmission line; the sample of voltage on the transmission line containing both the forward and reflected voltage on the transmission line, with the forward and reflected voltage being in-phase with each other;

the reflected transimpedance operational amplifier receives a downstream sample of a current travelling on the transmission line from the downstream end of the coil; the downstream sample of current comprising both a current sample travelling in the reflected direction and a current sample travelling in the forward direction on the transmission line; the current sample travelling in the reflected direction is in phase with the reflected voltage on the transmission line and the current sample travelling in the forward direction is equal in magnitude with and 180 degrees out of phase from the sample of forward voltage on the transmission line; reflected transimpedance operational amplifier outputs a voltage representative of the upstream current travelling on the transmission line; and wherein the outputs of the reflected transimpedance operational amplifier and the voltage operational amplifier are combined and outputted using the reflected RF power output; when combined, the voltage representation of the current sample travelling in the forward direction cancels with the sample of the forward voltage on the transmission line, thereby only a voltage representative of RF power travelling in the reflected direction on the transmission line is present at the reflected RF power output.

12. The directional coupler of claim 11, wherein the voltage operational amplifier unloads the capacitive voltage divider, the forward transimpedance operational amplifier provides a short circuit to ground to the upstream end of the coil, and the reflected transimpedance operational amplifier provides a short circuit to ground to the downstream end of the coil, wherein the short circuiting of the coil eliminates the frequency dependence of the coil when sampling current on the transmission line.

13. The directional coupler of claim 11, wherein the capacitive divider is comprised of a first capacitor and at least one second capacitor; the first capacitor is an airgap capacitor formed by the center conductor of the transmission line and a plate.

14. The directional coupler of claim 13, wherein one of the at least one second capacitor is variable.

15. The directional coupler of claim 11, wherein the outputs from the forward transimpedance operational amplifier and voltage operational amplifier are AC coupled prior to being added together; wherein the outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

16. The directional coupler of claim 11, further comprising a shield to isolate the coil from an electric field of the transmission line.

17. The directional coupler of claim 16, wherein the shield is grounded on a single side.

18. The directional coupler of claim 11, wherein the directional coupler circuit can be tuned by using a reflected transimpedance operational amplifier feedback resistor, a forward transimpedance operational amplifier feedback resistor, and/or a first capacitor and a second capacitor of the capacitive voltage divider.

19. The directional coupler of claim 11, wherein the directional coupler circuit has less than about a 10% variation in coupling and a directivity of at least about 30 dB over at least about a 150:1 frequency range.

20. The directional coupler of claim 11, wherein the coil for sampling current travelling in a forward direction and a reflected direction on the transmission line is a single coil.

21. A method of using a directional coupler circuit, the method comprising:

providing a directional coupler circuit having a transmission line, a capacitive divider, a coil, a combined forward path, and a combined reflected path;
wherein the combined forward path comprises a forward transimpedance operational amplifier, a voltage operational amplifier, and a forward RF power output;
wherein the combined reflected path comprises a reflected transimpedance operational amplifier, a voltage operational amplifier, and a reflected RF power output;

sampling a voltage on a center conductor of the transmission line using the capacitive divider;

sampling current travelling in a forward direction and a reflected direction on the transmission line using the coil, the coil having mutual inductance with the center conductor, the coil having an upstream end and a downstream end, wherein the coil is configured for sampling current travelling in both the forward direction and the reflected direction on the transmission line;

receiving a sample of the voltage on the transmission line from the capacitive divider and outputting a voltage representative of the voltage on the transmission line, using the voltage operational amplifier; the sample of voltage on the transmission line containing both the forward and reflected voltage on the transmission line, with the forward and reflected voltage being in-phase with each other;

receiving an upstream sample of a current travelling on the transmission line from the upstream end of the coil and outputting a voltage representative of the upstream sample of current travelling on the transmission line using the forward transimpedance operational amplifier, the upstream sample of current comprising both a current sample travelling in the forward direction and a current sample travelling in the reflected direction on the transmission line; the current sample travelling in the forward direction is in phase with the forward voltage on the transmission line, and the current sample travelling in the reflected direction is equal in magnitude with and 180 degrees out of phase from the sample of the reflected voltage on the transmission line;

combining the outputs of the forward transimpedance operational amplifier and the voltage operational amplifier and outputting the combined outputs using the forward RF power output; when combined, the voltage representation of the current sample travelling in the reflected direction cancels with the sample of the reflected voltage on the transmission line, thereby only a voltage representative of RF power travelling in the forward direction on the transmission line is outputted using the forward RF power output;

receiving a sample of the voltage on the transmission line from the capacitive divider and outputting a voltage representative of the voltage on the transmission line the voltage operational amplifier; the sample of voltage on the transmission line containing both the forward and reflected voltage on the transmission line, with the forward and reflected voltage being in-phase with each other;

receiving a downstream sample of a current travelling on the transmission line from the downstream end of the coil outputs a voltage representative of the downstream current travelling on the transmission line using the reflected transimpedance operational amplifier; the downstream sample of current comprising both a current sample travelling in the reflected direction and a current sample travelling in the forward direction on the transmission line; the current sample travelling in the reflected direction is in phase with the reflected voltage on the transmission line and the current sample travelling in the forward direction is equal in magnitude with and 180 degrees out of phase from the sample of forward voltage on the transmission line;

combining the outputs of the reflected transimpedance operational amplifier and the voltage operational amplifier and outputting the combined outputs using the reflected RF power output; when combined, the voltage representation of the current sample travelling in the forward direction cancels with the sample of the forward voltage on the transmission line, thereby only a voltage representative of RF power travelling in the reflected direction on the transmission line is outputted using the reflected RF power output.

22. The method of using a directional coupler circuit of claim 21, wherein the voltage operational amplifier unloads the capacitive voltage divider, the forward transimpedance operational amplifier provides a short circuit to ground to the upstream end of the coil, and the reflected transimpedance operational amplifier provides a short circuit to ground to the downstream end of the coil, wherein the short circuiting of the coil eliminates the frequency dependence of the coil when sampling current on the transmission line.

23. The method of using a directional coupler circuit of claim 21, wherein the capacitive divider is comprised of a first capacitor and at least one second capacitor; the first capacitor is an airgap capacitor formed by the center conductor of the transmission line and a plate.

24. The method of using a directional coupler circuit of claim 23, wherein one of the at least one second capacitor is variable.

25. The method of using a directional coupler circuit of claim 21, wherein the outputs from the forward transimpedance operational amplifier and voltage operational amplifier are AC coupled prior to being added together; wherein the outputs are AC coupled using forward transimpedance operational amplifier coupling resistor, voltage operational amplifier forward coupling resistor, forward transimpedance operational amplifier coupling capacitor, and voltage operational amplifier forward coupling capacitor prior to being outputted using the forward RF power output.

26. The method of using a directional coupler circuit of claim 21, wherein the directional coupler circuit further includes a shield to isolate the coil from an electric field of the transmission line.

27. The method of using a directional coupler circuit of claim 26, wherein the shield is grounded on a single side.

28. The method of using a directional coupler circuit of claim 21, wherein the directional coupler circuit can be tuned by using a reflected transimpedance operational amplifier feedback resistor, a forward transimpedance operational amplifier feedback resistor, and/or a first capacitor and a second capacitor of the capacitive voltage divider.

29. The method of using a directional coupler circuit of claim 21, wherein the directional coupler circuit has less than about a 10% variation in coupling and a directivity of at least about 30 dB over at least about a 150:1 frequency range.

30. The method of using a directional coupler circuit of claim 21, wherein the coil for sampling current travelling in a forward direction and a reflected direction on the transmission line is a single coil.

* * * * *